United States Patent
Chamorro et al.

(10) Patent No.: US 8,948,918 B2
(45) Date of Patent: Feb. 3, 2015

(54) OUTDOOR FAN AND INDOOR BLOWER CONTROLLER FOR HEATING, VENTILATION AND AIR CONDITIONING SYSTEM AND METHOD OF OPERATION THEREOF

(75) Inventors: Carlos O. Chamorro, Plano, TX (US); Roger C. Hundt, Carrollton, TX (US); John P. Stachler, Plano, TX (US); Stephen A. Walter, Flower Mound, TX (US)

(73) Assignee: Lennox Industries Inc., Richardson, TX (US)

( * ) Notice: Subject to any disclaimer, the term of this patent is extended or adjusted under 35 U.S.C. 154(b) by 1084 days.

(21) Appl. No.: 12/694,392

(22) Filed: Jan. 27, 2010

(65) Prior Publication Data

US 2010/0298982 A1 Nov. 25, 2010

Related U.S. Application Data

(60) Provisional application No. 61/180,405, filed on May 21, 2009.

(51) Int. Cl.
*G05B 15/00* (2006.01)
*H01R 13/645* (2006.01)
*H01R 12/50* (2011.01)

(52) U.S. Cl.
CPC ........ *H01R 13/6456* (2013.01); *H01R 23/7073* (2013.01)
USPC ............................... 700/276; 62/507; 62/510

(58) Field of Classification Search
USPC .......... 700/276, 277; 62/507, 510, 228.3, 175
See application file for complete search history.

(56) References Cited

U.S. PATENT DOCUMENTS

| 7,726,140 B2 * | 6/2010 | Rayburn et al. ................. 62/175 |
| 8,113,789 B2 * | 2/2012 | Douglas et al. ................. 417/38 |
| 2010/0011803 A1 * | 1/2010 | Warnecker et al. ............. 62/498 |
| 2010/0070907 A1 * | 3/2010 | Harrod et al. ................. 715/772 |
| 2011/0083454 A1 * | 4/2011 | Kopko et al. .................... 62/115 |

FOREIGN PATENT DOCUMENTS

JP 63-34443 * 2/1988

* cited by examiner

*Primary Examiner* — Sean Shechtman
*Assistant Examiner* — Steven Garland

(57) ABSTRACT

An HVAC controller, a method of operating an HVAC controller and an HVAC system employing the controller or the method. In one embodiment, the HVAC controller includes: (1) a processor couplable to at least two refrigerant pressure sensors via separate data paths to receive input signals therefrom and further couplable to a compressor stage and a condenser fan to provide output signals thereto and (2) memory coupled to the processor and configured to store a software program capable of causing the processor to command the compressor stage and the condenser fan to turn on irrespective of a state of an input signal generated by either of the at least two refrigerant pressure sensors and generate alternative error messages at least partially depending upon whether or not a high pressure shutdown occurs after the processor commands the compressor stage and the fan to turn on.

21 Claims, 4 Drawing Sheets

OUTDOOR FAN AND INDOOR BLOWER CONTROLLER FOR HEATING, VENTILATION AND AIR CONDITIONING SYSTEM AND METHOD OF OPERATION THEREOF

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," commonly assigned with this application and incorporated herein by reference.

TECHNICAL FIELD

This application is directed, in general, to heating, ventilation and air conditioning (HVAC) systems and, more specifically, to an outdoor fan and indoor blower controller for an HVAC system and method of operating the same.

BACKGROUND

HVAC systems should be capable of operating efficiently under a wide range of outdoor temperatures. Current HVAC systems control outdoor (condenser) fan and indoor blower speed based on the cooling required to be provided by the system. In many such systems, outdoor fan speed is controlled such that refrigerant pressure remains within a desired range. Excessive pressure risks refrigerant leakage, and inadequate pressure risks compressor damage or failure. Subject to maintaining pressure within a desired range, the system as a whole is then controlled to operate as efficiently as possible. Some HVAC systems employ multistage compressors and multiple outdoor fans to increase operating efficiency.

SUMMARY

One aspect provides an HVAC controller. In one embodiment, the HVAC controller includes: (1) a processor couplable to at least two refrigerant pressure sensors via separate data paths to receive input signals therefrom and further couplable to a compressor stage and a condenser fan to provide output signals thereto and (2) memory coupled to the processor and configured to store a software program capable of causing the processor to command the compressor stage and the condenser fan to turn on irrespective of a state of an input signal generated by either of the at least two refrigerant pressure sensors and generate alternative error messages at least partially depending upon whether or not a high pressure shutdown occurs after the processor commands the compressor stage and the fan to turn on.

Another aspect provides a method of operating an HVAC system. In one embodiment, the method includes: (1) commanding a compressor stage and an associated condenser fan to turn on irrespective of a state of an input signal generated by a refrigerant pressure sensor associated with the condenser fan and (2) generating alternative error messages at least partially depending upon whether or not a high pressure shutdown occurs after the commanding.

Another aspect provides an HVAC system. In one embodiment, the HVAC system includes: (1) an outdoor unit, including: (1a) at least two compressor stages, (1b) at least two corresponding condenser fans, (1c) at least two corresponding refrigerant pressure sensors, (1d) at least one condenser coil and (1e) an outside air temperature sensor, (2) an indoor unit, including: (2a) at least one evaporator coil, (2b) at least one indoor blower and (2c) at least one expansion valve and (3) an HVAC controller, including: (3a) a processor couplable to the at least two refrigerant pressure sensors via separate data paths to receive input signals therefrom and further couplable to the at least two compressor stages and the at least two condenser fans to provide output signals thereto and (3b) memory coupled to the processor and configured to store a software program capable of causing the processor to command one of the at least two compressor stages and a corresponding one of the at least two condenser fans to turn on irrespective of a state of an input signal generated by either of the at least two refrigerant pressure sensors and generating alternative error messages at least partially depending upon whether or not a high pressure shutdown occurs after the processor commands the one of the at least two compressor stages and the corresponding one of the at least two condenser fans to turn on.

BRIEF DESCRIPTION

Reference is now made to the following descriptions taken in conjunction with the accompanying drawings, in which.

DETAILED DESCRIPTION

Figure 1:
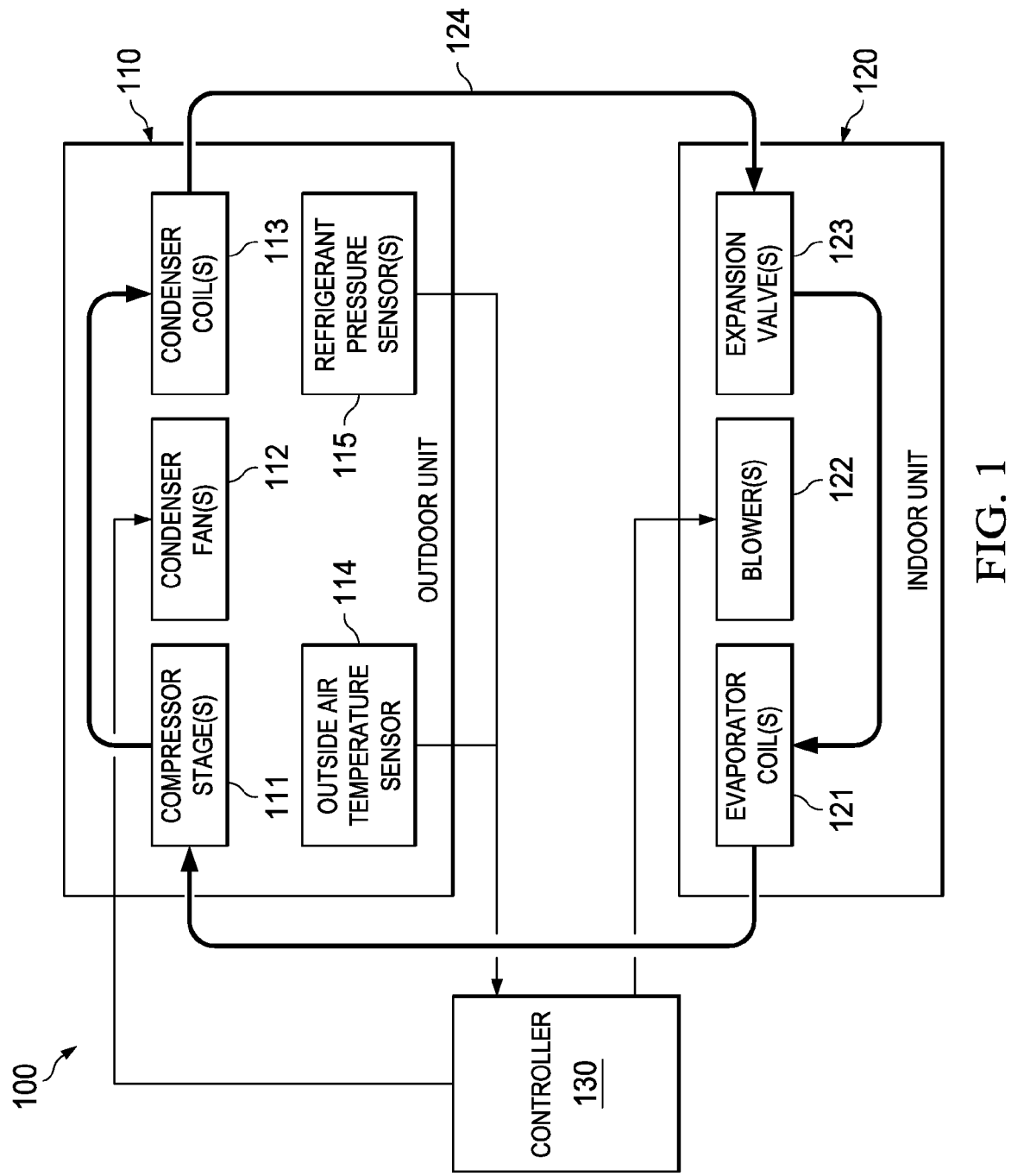
FIG. 1 is a block diagram of one embodiment of an HVAC system including one embodiment of an outdoor fan and indoor blower controller constructed according to the principles of the invention.

FIG. 1 is a block diagram of one embodiment of an HVAC system 100 including one embodiment of an outdoor fan and indoor blower controller constructed according to the principles of the invention. The HVAC system 100 includes an outdoor unit 110, which may be a rooftop unit, and an indoor unit 120. The outdoor unit 110 and the indoor unit 120 are represented as being separate, but in fact may be housed in a common enclosure.

The illustrated embodiment of the outdoor unit 110 includes one or more compressors each having one or more stages 111. One or more condenser fans 112 are associated with one or more condenser coils 113 to move air across the one or more condenser coils 113. An outside air temperature sensor 114 is situated in or on the outdoor unit 110 to detect an ambient outdoor air temperature, and one or more refrigerant pressure sensors 115 are situated in or on the outdoor unit to detect refrigerant pressure in the one or more condenser coils 113. In the illustrated embodiment, at least one refrigerant pressure sensor, a low ambient pressure switch, is associated with each condenser coil and is configured to change switch state (open or close) as a function of the pressure of refrigerant in its associated coil relative to a pre-established pressure at a lower end of an acceptable pressure range. In another embodiment, a high ambient pressure switch is also associated with each condenser coil and is configured to change switch state as a function of the pressure of refrigerant in its associated coil relative to a pre-established pressure at a higher end of an acceptable pressure range.

The illustrated embodiment of the indoor unit 120 includes one or more evaporator coils 121. One or more blowers 122, sometimes known as indoor blowers, are associated with the one or more evaporator coils 121 to move air across the one or more evaporator coils 121. One or more expansion valves 123 are coupled to one or more corresponding refrigerant conduits 124. The one or more refrigerant conduits 124 couple the one or more stages 111 of the one or more compressors, the one or more condenser coils 113, the one or more expansion valves 123 and the one or more evaporator coils 121 to form a loop within which a refrigerant (e.g., a hydrofluorocarbon fluid) is repeatedly compressed, cooled, decompressed and warmed to effect air conditioning. In one embodiment, the indoor unit 120 includes one or more heater coils (not shown) associated with the one or more blowers 122 to effect heating. In another embodiment, the one or more blowers 122 may be activated separately to effect ventilation.

As stated above, the illustrated embodiment of the system 100 further includes an outdoor fan and indoor blower controller 130. The illustrated embodiment of the controller 130 is configured to receive input signals from, perhaps among other things, the outside air temperature sensor 114 and the one or more refrigerant pressure sensors 115 and generate output signals to control, perhaps among other things, the one or more condenser fans 112 and the one or more blowers 122. A user interface (not shown), perhaps including an indoor temperature sensor, is coupled to the controller 130 and configured to allow a user to select a setpoint indoor temperature and perhaps a system operational mode (i.e., air conditioning, heating or ventilation). Those skilled in the pertinent art are familiar with the manner in which HVAC systems, such as the HVAC system 100 of FIG. 1, may be controlled by a user.

Figure 2:
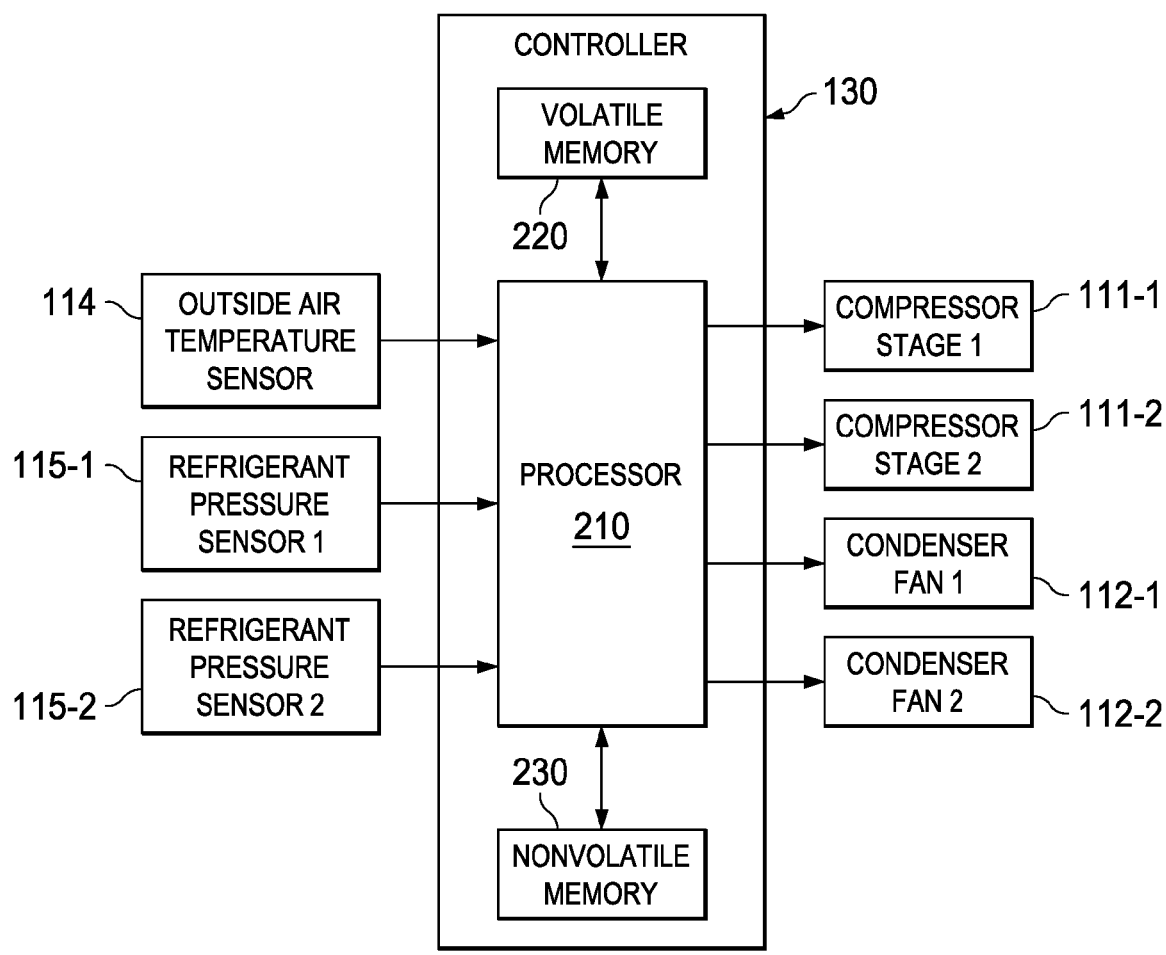
FIG. 2 is a block diagram of one embodiment of the controller of FIG. 1.

FIG. 2 is a block diagram of one embodiment of the outdoor fan and indoor blower controller 130 of FIG. 1. In the embodiment of FIG. 2, the controller 130 takes the form of a general purpose microcontroller and contains a processor 210 configured to execute software (e.g., firmware) instructions, a volatile memory 220 coupled to the processor 210 and configured to store software instructions, data or both software instructions and data and nonvolatile memory 230 coupled to the processor 210 and configured to store software instructions, data or both software instructions and data. In the embodiment of FIG. 2, the nonvolatile memory 230 stores the software instructions and persistent data (e.g., factory settings and messages) that enable the operation of the controller 130, and the volatile memory 220 stores data that the controller 130 collects during its operation and stores temporarily for internal use or external recall (e.g., scratchpad data and operational logs).

As FIG. 2 shows, an outside air temperature sensor 114 and first and second refrigerant pressure sensors 115-1, 115-2 are coupled to the processor 210 to provide input signals thereto. Likewise, the processor 210 is coupled to first and second compressor stages 111-1, 111-2 and corresponding first and second condenser fans 112-1, 112-2. Thus the specific embodiment of the controller 130 illustrated in FIG. 2 is configured for use in an HVAC system that has two compressor stages, two condenser coils and two corresponding condenser fans. Of course, as stated above, other embodiments of the controller 130 accommodate other numbers of compressor stages, condenser coils and condenser fans.

It should be noted that each of the sensors 114, 115-1, 115-2 has a separate data path to the processor 210, and that the processor 210 has a separate data path to each of the stages and fans 111-1, 111-2, 112-1, 112-2. The provision of the separate data path may be colloquially referred to as "home running." The separate data paths may be separate wireline buses or wireless channels or time-divided or code-divided allocations of a shared wireline bus or wireless channel. The object of the separate data paths is that each of the sensors 114, 115-1, 115-2 can transmit its input signal separately to the processor 210, and the processor can transmit its output signals separately to each of the stages and fans 111-1, 111-2, 112-1, 112-2. Thus the output of each of the sensors 114, 115-1, 115-2 can be separately sensed, and each of the stages and fans 111-1, 111-2, 112-1, 112-2 can be separately controlled.

As stated above, many HVAC systems control outdoor fan speed such that refrigerant pressure remains within a desired range. In systems having only a single compressor stage, a pressure sensor on the condenser coil directly controls the one or more fans; no effort is made to control the condenser fans based on outside air temperature. In systems having multiple compressor stages, some applications benefit from controlling the condenser fans based on both condenser coil pressure and outside air temperature. Unfortunately, the controller's hardware interlock prevents this from being achieved directly. Instead, it is achieved by bypassing the interlock and connecting multiple pressure sensors in parallel. Besides being cumbersome, the parallel-coupled sensors cannot be separately detected or diagnosed. As a result, a single faulty sensor can needlessly impair the operation of the HVAC system as a whole, either by wasting energy by causing one or more fans to operate when they need not or by risking harm to one or more compressors by preventing the one or more fans from operating when they should. The controller 130 of FIG. 2 does not have a hardware interlock and thus accommodates home running of the multiple pressure sensors. As a result, the controller 130 avoids the need to couple pressure sensors in parallel and allows sensor-specific diagnostics.

In various embodiments, the controller 130 allows multiple fans to be controlled based on pressure, temperature, or both pressure and temperature at different setpoints, even for a single compressor system, without additional control apparatus other than that needed to power the fan. In various other embodiments, the controller 130 can control more than one fan based on different temperature setpoints or based on the input signals produced by any of the pressure sensors. As a result, the controller 130 can detect the status of the different pressure sensors, act according to a pre-programmed sequence of operation, and determine based on the different conditions whether a given pressure sensor is good or faulty. Once a faulty sensor is identified, various embodiments of the controller 130 can provide error messages (e.g., codes or phrases) for service, including component repair or replacement, while continuing to run the one or more fans without the faulty sensor. The ability to continue to run the HVAC system even when a pressure sensor is faulty prevents potential damage that may result from a faulty pressure sensor and increases the overall reliability of the HVAC system.

Figure 3A:
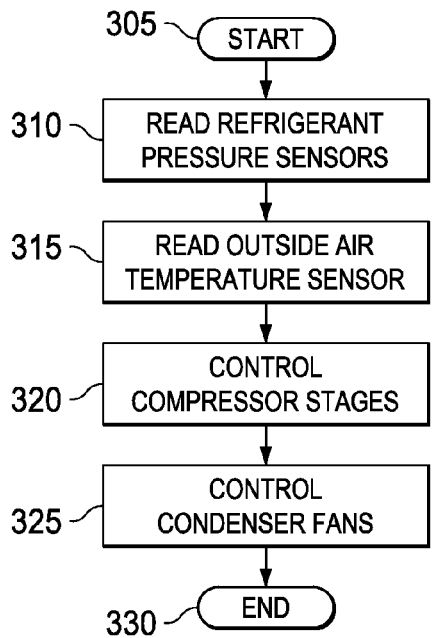
FIGS. 3A and 3B are flow diagrams of one embodiment of a method of operating an outdoor fan of an HVAC system carried out according to the principles of the invention.
Figure 3B:
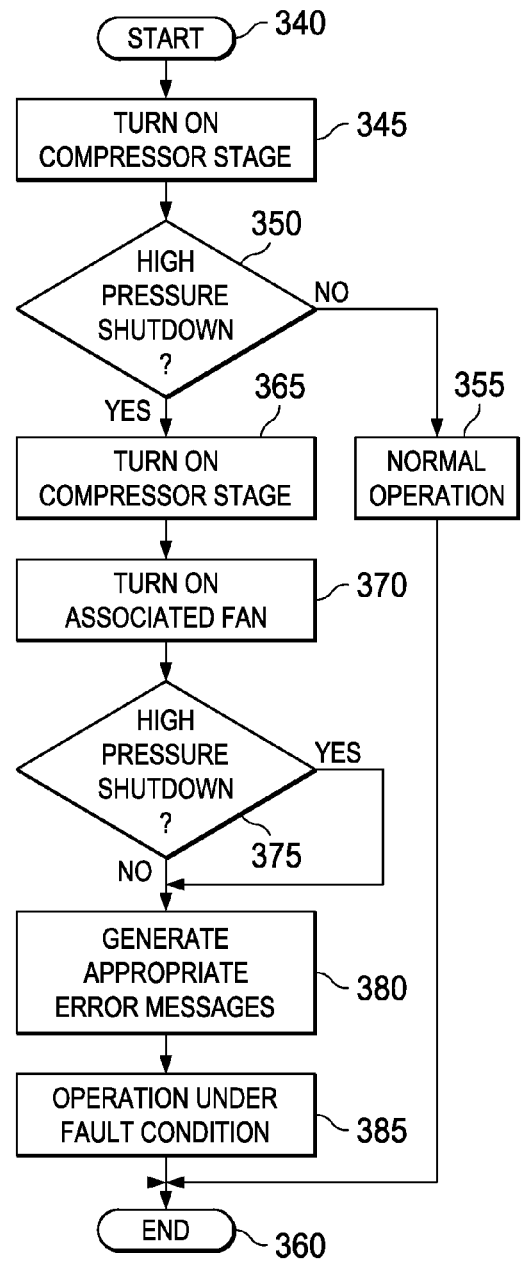

FIGS. 3A and 3B are flow diagrams of one embodiment of a method of operating an outdoor fan of an HVAC system carried out according to the principles of the invention. The method of FIG. 3A begins in a start step 305, when conditions are such that air conditioning is desirable. In a step 310, the one or more refrigerant pressure sensors (e.g., one or more low and/or high ambient pressure switches) are read. In a step 315, the outside air temperature sensor is also read. Based on the states of the one or more refrigerant pressure sensors and the outside air temperature sensor, one or more stages of the compressor are controlled (e.g., turned on or off) in a step 320. Also, based on the states of the one or more refrigerant pressure sensors and the outside air temperature sensor, one or more condenser fans are controlled (e.g., turned on or off)

in a step 325. For example, if an outdoor air temperature is 85° F. and a desired indoor setpoint temperature is 72° F., the size of the HVAC system may have been chosen such that only a single stage of a two-stage compressor is needed to maintain the desired setpoint temperature at that given outdoor air temperature. Accordingly, the controller produces an output signal that commands the single stage to begin operation. As a result, refrigerant pressure downstream of the compressor stage increases, causing the associated low ambient pressure switch to change state and generate a corresponding input signal to the controller. This input signal, perhaps in conjunction with other input signals or parameters such as time, in turn causes the controller to turn on an associated fan to reduce the rate of increase of the refrigerant pressure. The method ends in an end step 330.

However, turning now to FIG. 3B, it will now be assumed that either a low ambient pressure switch or a condenser fan has failed. The method of FIG. 3B presents one embodiment of a method by which diagnostics may be performed with respect to the HVAC system and begins in a start step 340, when it is desired to activate air conditioning. Accordingly, the controller turns on at least one compressor stage in a step 345. Assuming a high ambient pressure switch located downstream of the compressor stage is coupled to the controller, the output signal from that switch determines the outcome of a decisional step 350. The purpose of the high ambient pressure switch is to protect the HVAC system against the harm that may result from excessive refrigerant pressure. A failure of a fan to operate to cool its associated condenser coil is often the cause of excessive refrigerant pressure. If the output signal indicates that refrigerant pressure remains in the acceptable range, normal operation ensues in a step 355, and the method ends in a step 360.

On the other hand, if excessive refrigerant pressure causes the high ambient pressure switch to change state, it cannot directly be determined whether a faulty low pressure ambient switch failed to change state to activate the condenser fan, or whether the low ambient pressure switch did close, but the fan was unable to respond, perhaps due to a fault in wiring leading to the fan, an actuator providing power to the fan, or the fan itself. Irrespectively, if the output signal of a high ambient pressure switch causes the controller to respond with a high pressure shutdown of the HVAC system, a preprogrammed delay ensues, after which the controller generates an output signal to command the at least one compressor stage to turn on again in a step 365. The controller then generates an output signal to command the associated at least one condenser fan turn on again in a step 370. If a high pressure shutdown does not again ensue in a decisional step 375, the controller can then assume that the associated at least one fan did turn on and that a faulty low ambient pressure switch likely prevented the at least one fan from turning on previously. The controller then generates an appropriate error message indicating that a low ambient pressure switch is faulty in a step 380. The controller then causes the HVAC system to operate under a fault condition (namely the faulty low ambient pressure switch) in a step 385, whereupon the method ends in the end step 355. In various embodiments, the controller may also alert the customer that the system is operating under a fault condition if the controller is part of a network, e.g., a Building Automation System (BAS).

If, on the other hand, a high pressure shutdown does again ensue in the decisional step 375, the controller can then assume that the at least one fan did not turn on as commanded and that the at least one fan or wiring leading to it is faulty. The controller then generates an appropriate error message indicating that one or more condenser fans are not operating in the step 380. The controller can then attempt continued operation of the HVAC system under fault condition. As above, the controller may also alert the customer that the system is operating under a fault condition if the controller is part of a network. In one embodiment, the controller determines whether alternative compressors or stages associated with operable condenser fans may be turned on. In another embodiment, the controller operates the fewer remaining operable fans at a higher speed if the system has a variable speed fan or Electronic Conmutated Motor (ECM). In yet another embodiment, the controller turns on one or more fans that had been turned off. In still another embodiment, the controller determines that other fans are not available and commands the HVAC system to shut down pending repair. In a more specific embodiment, the controller broadcasts an alarm signal through a network to inform the customer of a shutdown condition so the system can be repaired.

Figure 4:
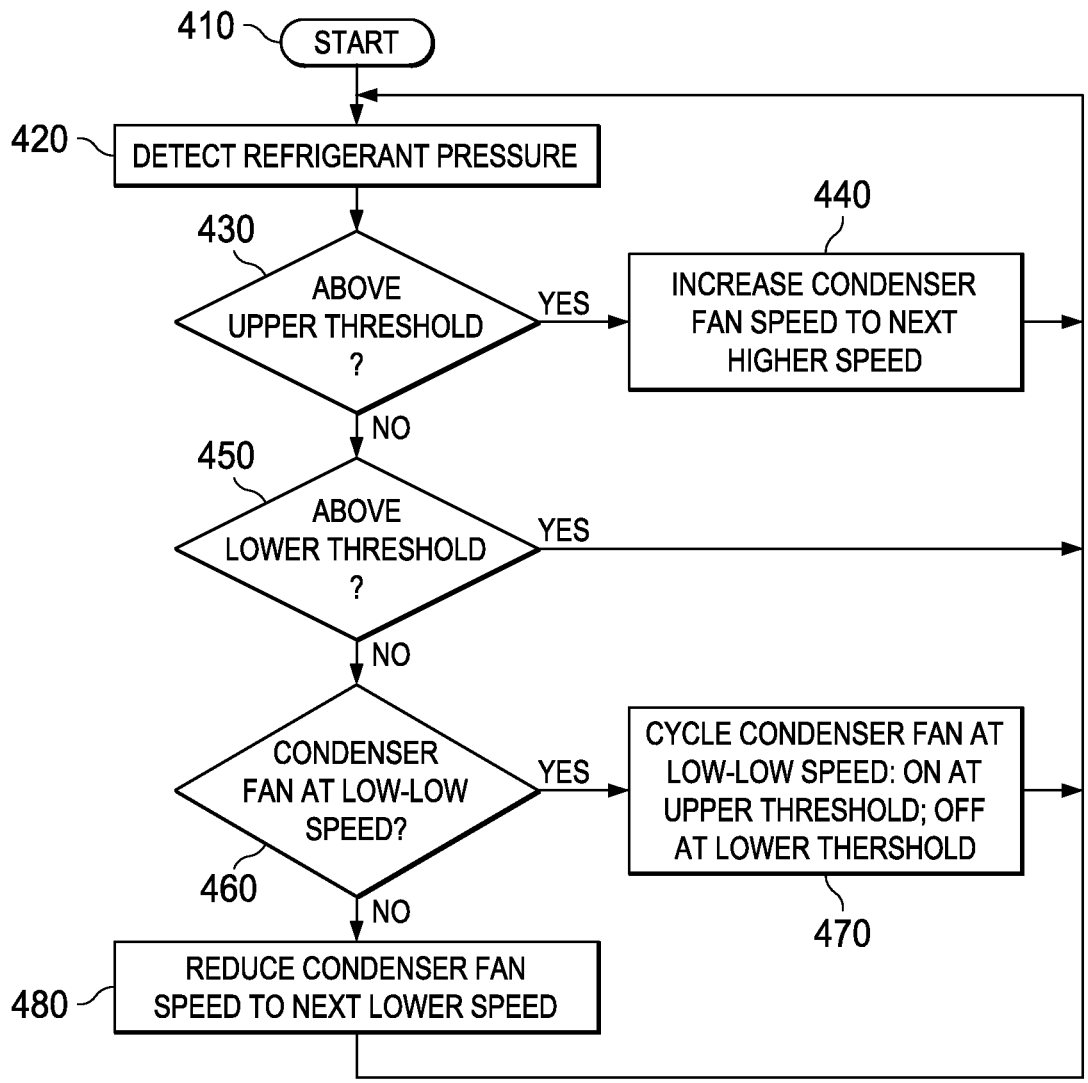
FIG. 4 is a flow diagram of one embodiment of a method of operating an outdoor fan of an HVAC system carried out according to the principles of the invention

Various embodiments of the controller can perform other operations that allow the HVAC system to operate under conditions in which outside air temperatures are exceptionally cold, for example, less than 55° F. Conventional HVAC systems have trouble operating under such exceptionally cold conditions, because while their condenser fans should operate to avoid excessive refrigerant pressure in the condenser coils, operation of the fans in such low outside air temperatures can over-cool the condenser coils, causing inadequate refrigerant pressure. As stated above, operation either above or below an acceptable refrigerant pressure range can harm the HVAC system. Introduced herein are various embodiments of an HVAC controller and method for accommodating HVAC system operation under relatively low outside air temperatures. FIG. 4 is a flow diagram of one embodiment of a method of operating an outdoor fan of an HVAC system carried out according to the principles of the invention. The method begins in a step 410. In a step 420, refrigerant pressure is detected.

In one embodiment, refrigerant pressure is detected by determining if it is within or without an acceptable range. This can be performed with low and high ambient pressure switches. Depending upon the states of the two pressure switches, it can be determined whether the refrigerant is: (1) below a lower pressure threshold, (2) above the lower threshold but below an upper pressure threshold, or (3) above the upper threshold.

In a decisional step 430, if the refrigerant temperature is above the upper threshold (indicating a refrigerant pressure above the acceptable range), the outcome of the decisional step 430 is YES, and the controller commands a condenser fan to increase its speed to the next higher speed in a step 440. For example, if the condenser fan is running at a low-low speed, the controller commands the condenser fan to increase its speed to a low speed. If the condenser fan is running at a low speed, the controller commands the condenser fan to increase its speed to a high speed. The refrigerant pressure is detected again at a later time in the step 420. For purposes of this invention, a low-low speed is a speed that is lower than the speed at which a fan or blower normally runs when the HVAC system is first-stage cooling. In the embodiment of FIG. 4, an example low-low speed may be about 300 RPM, a low speed may be about 600 RPM, and a high speed may be about 900 RPM.

If the outcome of the decisional step 430 is NO, in a decisional step 450 it is determined if the refrigerant temperature is above the lower threshold (indicating a refrigerant pressure within the acceptable range), the outcome of the decisional step is YES, and the controller does not command the condenser fan speed to change. The refrigerant pressure is detected again at a later time in the step 420.

If the outcome of the decisional step 450 is NO (indicating a refrigerant pressure below the acceptable range), it is determined in a decisional step 460 if the condenser fan is running at a low-low speed. If the outcome of the decisional step 460 is YES, the method proceeds to the step 470 in which the controller calls for the condenser fan to continue to operate at the low-low speed until the lower threshold is reached, at which time the controller calls for the condenser fan to turn off. The condenser fan then remains off until the upper threshold is reached, at which time the controller calls for the fan to turn back on at the low-low speed. The refrigerant pressure is detected again at a later time in the step 420.

If the outcome of the decisional step 460 is NO, and the controller commands a condenser fan to decrease its speed to the next lower speed in a step 480. For example, if the condenser fan is running at a high speed, the controller commands the condenser fan to decrease its speed to a low speed. If the condenser fan is running at a low speed, the controller commands the condenser fan to decrease its speed to a low-low speed.

In certain embodiments, the controller can control an indoor blower to operate at a low-low speed to improve ventilation or for other purposes when the compressor is turned off. In still other embodiments, the controller may command a damper to open to allow outdoor air to flow to the blower, perhaps across a filter to reduce particulate matter beforehand. This ostensibly lowers the temperature of the indoor air the blower is circulating.

Those skilled in the art to which this application relates will appreciate that other and further additions, deletions, substitutions and modifications may be made to the described embodiments.

What is claimed is:

1. An HVAC controller, comprising:
a processor couplable to at least two refrigerant pressure sensors via separate data paths to receive input signals therefrom and further couplable to a compressor stage and a condenser fan to provide output signals thereto; and
memory coupled to said processor and storing a software program having program instructions capable of causing said processor to command said compressor stage and said condenser fan to turn on irrespective of a state of an input signal generated by either of said at least two refrigerant pressure sensors and generate alternative error messages at least partially depending upon whether or not a high pressure shutdown occurs after said processor commands said compressor stage and said fan to turn on.

2. The HVAC controller as recited in claim 1 wherein said at least two refrigerant pressure sensors comprise at least two low ambient pressure switches.

3. The HVAC controller as recited in claim 1 wherein said data paths are separate wireline buses.

4. The HVAC controller as recited in claim 1 wherein said software program is further capable of causing said processor to command said high pressure shutdown and causing said processor to command said compressor stage and said fan to turn on after an initial high pressure shutdown occurs.

5. The HVAC controller as recited in claim 1 wherein said processor is further couplable to an outside air temperature sensor via a separate data path to receive an input signal therefrom and said software program is further capable of causing said processor to generate said output signals at least partially based on said input signal from said outside air temperature sensor.

6. The HVAC controller as recited in claim 1 wherein said software program is further capable of causing said processor to command said compressor stage to turn on and said condenser fan to run at a low-low speed based on a refrigerant pressure.

7. The HVAC controller as recited in claim 1 wherein said processor is further couplable to an indoor blower to provide an output signal thereto and said software program is further capable of causing said processor to command said compressor stage to turn off, said condenser fan to run and said indoor blower to run at a low-low speed.

8. A method of operating an HVAC system, comprising:
commanding a compressor stage and an associated condenser fan to turn on irrespective of a state of an input signal generated by at least two refrigerant pressure sensors associated with said condenser fan; and
generating alternative error messages at least partially depending upon whether or not a high pressure shutdown occurs after said commanding.

9. The method as recited in claim 8 wherein said at least two refrigerant pressure sensors comprises at least two low ambient pressure switches.

10. The method as recited in claim 8 wherein said input signal is transmitted along a separate wireline bus for said at least two refrigerant pressure sensors.

11. The method as recited in claim 8 further comprising:
commanding said high pressure shutdown; and
commanding said compressor stage and said fan to turn on after an initial high pressure shutdown occurs.

12. The method as recited in claim 8 further comprising:
receiving an input signal from an outside air temperature sensor; and
generating output signals at least partially based on said input signal from said outside air temperature sensor.

13. The method as recited in claim 8 further comprising commanding said compressor stage to turn on and said condenser fan to run at a low-low speed based on a refrigerant pressure.

14. The method as recited in claim 8 further comprising commanding said compressor stage to turn off, said condenser fan to run and an indoor blower to run at a low-low speed.

15. An HVAC system, comprising:
an outdoor unit, including:
at least two compressor stages,
at least two corresponding condenser fans,
at least two corresponding refrigerant pressure sensors,
at least one condenser coil, and
an outside air temperature sensor;
an indoor unit, including:
at least one evaporator coil,
at least one indoor blower, and
at least one expansion valve; and
an HVAC controller, including:
a processor couplable to said at least two refrigerant pressure sensors via separate data paths to receive input signals therefrom and further couplable to said at least two compressor stages and said at least two condenser fans to provide output signals thereto, and
memory coupled to said processor and storing a software program having instructions capable of causing said processor to command one of said at least two compressor stages and a corresponding one of said at least two condenser fans to turn on irrespective of a state of an input signal generated by either of said at least two refrigerant pressure sensors and generating alternative error messages at least partially depending upon whether or not a high pressure shutdown occurs after said processor commands said one of said at least two compressor stages and said corresponding one of said at least two condenser fans to turn on.

16. The system as recited in claim 15 wherein said at least two refrigerant pressure sensors comprise at least two low ambient pressure switches.

17. The system as recited in claim 15 wherein said data paths are separate wireline buses.

18. The system as recited in claim 15 wherein said software program is further capable of causing said processor to command said high pressure shutdown and causing said processor to command said one of said at least two compressor stages and said corresponding one of said at least two fans to turn on after an initial high pressure shutdown occurs.

19. The system as recited in claim 15 wherein software program is further capable of causing said processor to generate said output signals at least partially based on said input signal from said outside air temperature sensor.

20. The system as recited in claim 15 wherein said software program is further capable of causing said processor to command said one of said at least two compressor stages to turn on and said corresponding one of said at least two condenser fans to run at a low-low speed based on a refrigerant pressure.

21. The system as recited in claim 15 wherein said software program is further capable of causing said processor to command said one of said at least two compressor stages to turn off, said one of said at least two condenser fans to run and one of said at least two indoor blowers to run at a low-low speed.

* * * * *